United States Patent [19]
Dent

[11] Patent Number: 5,727,023
[45] Date of Patent: Mar. 10, 1998

[54] APPARATUS FOR AND METHOD OF SPEECH DIGITIZING

[75] Inventor: Paul W. Dent, Stehag, Sweden

[73] Assignee: Ericsson Inc., Research Triangle Park, N.C.

[21] Appl. No.: 120,426

[22] Filed: Sep. 14, 1993

Related U.S. Application Data

[63] Continuation-in-part of Ser. No. 967,027, Oct. 27, 1992.

[51] Int. Cl.$^6$ ................................................ H04B 14/06
[52] U.S. Cl. ........................ 375/244; 375/249; 341/126; 341/143
[58] Field of Search ........................... 364/724; 341/126, 341/155, 159, 161, 164–168; 375/27, 28, 30, 32, 244, 247, 249, 251

[56] References Cited

U.S. PATENT DOCUMENTS

| | | | |
|---|---|---|---|
| 2,967,992 | 1/1961 | Scholten | 323/66 |
| 3,602,818 | 8/1971 | Anderlecht et al. | 325/65 |
| 3,706,944 | 12/1972 | Tewksbury | 375/249 |
| 3,906,166 | 9/1975 | Cooper et al. | 179/41 A |
| 3,949,299 | 4/1976 | Song | 325/38 B |
| 4,042,921 | 8/1977 | Smith | 375/249 |
| 4,123,709 | 10/1978 | Dodds et al. | 325/38 |
| 4,233,684 | 11/1980 | Eggermont | 375/249 |
| 4,352,191 | 9/1982 | Un | 375/30 |
| 4,355,401 | 10/1982 | Ikoma et al. | 375/5 |
| 4,400,585 | 8/1983 | Kaman et al. | 179/2 EB |
| 4,411,002 | 10/1983 | Auger | 375/30 |
| 4,438,523 | 3/1984 | Brandl | 371/37 |
| 4,455,676 | 6/1984 | Kaneda | 381/106 |
| 4,493,091 | 1/1985 | Gundry | 375/30 |
| 4,541,103 | 9/1985 | Gregorian et al. | 375/32 |

(List continued on next page.)

FOREIGN PATENT DOCUMENTS

| | | |
|---|---|---|
| 0 425 458 | 5/1991 | European Pat. Off. |
| 0 502 546 A2 | 9/1992 | European Pat. Off. |
| 60-46139 | 3/1985 | Japan . |
| WO 92/02991 | 2/1992 | WIPO . |

OTHER PUBLICATIONS

Motorola brochure, "Dyna T–A–C 6000X Universal Mobile Telephone," 1984.
IEEE Communications Magazine, "Trends in Cellular and Cordless Communications", D.J. Goodman, Jun. 1991, pp. 31–40.
Ericsson Review, "Introduction of Digital Cellular Systems in North America", F. Lindell and K. Raith, No. 2, 1990, vol. 67.
Global News, "Hughes Network Systems Jumps into the Cellular Arena with GM Backing", Feb. 1991, pp. 15–16.
"Audio compander squelches hiss and hum better than Dolby system", *Electronics*, vol. 52, No. 4, Feb. 15, 1979, pp. 70, 72.
R. Fisher, "Dual Mode Mobile Unit For Next Generation Digital Narrow Channel Cellular Telephone System," 38th IEEE Vehicular Technology Conference, 15–17 Jun. 1988, pp. 543–547.

*Primary Examiner*—Stephen Chin
*Assistant Examiner*—Bryan Webster
*Attorney, Agent, or Firm*—Burns, Doane, Swecker & Mathis, L.L.P.

[57] ABSTRACT

A speech encoder converts analog speech signals into a stream of binary coded speech samples. A circuit for performing analog to digital conversion compares an input speech signal with a signal from a digital integrator. Based on the comparison a series of decisions are registered which indicate a step sign of the input signal. A syllabic filter generates a step magnitude according to the registered decisions. The step sign and step magnitude are combined providing a sign/magnitude representation of the input signal. When the sign/magnitude representation is integrated digitally in a decimation filter a digital representation of the analog signal is formed. A speech decoder, the antithesis of the encoder, converts binary coded speech samples into an analog waveform in a manner opposite to the A/D conversion method.

32 Claims, 11 Drawing Sheets

U.S. PATENT DOCUMENTS

| | | | |
|---|---|---|---|
| 4,700,362 | 10/1987 | Todd et al. | 375/249 |
| 4,713,808 | 12/1987 | Gaskill et al. | 370/94 |
| 4,750,198 | 6/1988 | Harper | 379/59 |
| 4,783,644 | 11/1988 | Kilchsperger | 341/166 |
| 4,825,448 | 4/1989 | Critchlow et al. | 375/8 |
| 4,835,792 | 5/1989 | Davarian | 375/80 |
| 4,850,033 | 7/1989 | Eizenhöfer et al. | 455/56 |
| 4,857,915 | 8/1989 | Andros et al. | 340/825.44 |
| 4,903,319 | 2/1990 | Kasai et al. | 455/33 |
| 4,903,320 | 2/1990 | Hanawa | 455/34 |
| 4,989,230 | 1/1991 | Gillig et al. | 379/59 |
| 4,996,696 | 2/1991 | McCabe | 375/30 |
| 5,008,925 | 4/1991 | Pireh | 379/60 |
| 5,020,076 | 5/1991 | Cahill et al. | 375/5 |
| 5,020,093 | 5/1991 | Pireh | 379/59 |
| 5,029,233 | 7/1991 | Metroka | 455/11 |
| 5,048,059 | 9/1991 | Dent | 375/94 |
| 5,079,550 | 1/1992 | Sooch et al. | 341/143 |
| 5,084,669 | 1/1992 | Dent | 324/83 D |
| 5,119,397 | 6/1992 | Dahlin et al. | 375/5 |
| 5,124,703 | 6/1992 | Kaneaki et al. | 341/77 |
| 5,150,362 | 9/1992 | Akerberg | 370/95.1 |
| 5,163,159 | 11/1992 | Rich et al. | 455/74 |
| 5,189,593 | 2/1993 | Ooi | 455/195.1 |
| 5,220,275 | 6/1993 | Holmqvist | 324/76.82 |
| 5,251,232 | 10/1993 | Nonami | 375/5 |

1

APPARATUS FOR AND METHOD OF SPEECH DIGITIZING

This application is a continuation-in-part of U.S. patent application Ser. No. 967,027 entitled "Multi-Mode Signal Processing" filed Oct. 27, 1992.

BACKGROUND

The present invention relates to analog-to-digital (A/D) and digital-to-analog (D/A) conversion of speech signals. More particularly, the present invention relates to A/D and D/A convertors for pulse code modulation (PCM) telephone transmission and exchange systems, and radiotelephone systems in which speech or radio signals are at least in part processed numerically in digital signal processors (DSPs).

A purpose of A/D conversion is to accept an analog voice source signal, for example from a microphone, and convert the signal to a stream of digital samples for input to a DSP. A D/A convertor accepts processed, digital samples from a DSP and converts the samples to an analog waveform for driving, for example, an earphone.

Volume-produced devices such as telephones or cellular radio telephones utilize application specific integrated circuit (ASIC) chips for economic reasons, in which the A/D and D/A conversion processes are incorporated among the many functions the circuit chips perform. These chips display low power requirements consuming little electrical power which is advantageous, particularly when using battery-powered, handheld cordless phones, for example. The present invention provides an improved, low-power technique for speech digitization that is suitable for large scale integration in silicon chips.

Two principal techniques have been employed for the digitization of analog speech signals. These are the successive binary approximation technique, and the oversampled delta-sigma modulation technique.

In successive approximation A/D converters, an analog input signal sample is first compared with an analog voltage corresponding to a "1" in the most significant bit (MSB) position of the desired digital representation with a "0" in the remaining positions (100000 . . . ). If the input voltage is greater than the analog voltage, then a "1" is needed in the MSB position. However, if the input signal voltage is less than the analog voltage, a MSB of "1" is too large and a "0" is required. The MSB is set to A according to this comparison and a voltage is generated corresponding to a digital code (A100000 . . . ). If the input voltage is greater than the digital code, then a "1" in the second MSB position is required; otherwise a "0". Calling this decision B, a voltage corresponding to the code AB10000 . . . is now generated and compared with the input signal and so-on.

The practical disadvantage of the successive approximation technique is that the A/D convertor must incorporate a D/A convertor that must generate voltages corresponding to all possible codes, and the voltage accuracy needed to distinguish between 10000000 . . . and 01111111 . . . can be excessively high for greater than 8-bit conversion accuracy. The typical conversion accuracy required in speech applications is 13 bits, in order to encompass the full dynamic range of different speakers while preserving adequate quality. Accuracy of 13-bits requires resistors of extreme precision (e.g., 0.01%). Such technology may not be available for the same processes needed to fabricate other features of the desired silicon integrated circuit.

The second well-known technique generally employed is called oversampled delta or delta-sigma modulation. This technique avoids the need for precision component values. Oversampled delta-modulation involves comparing the voltage out of an integrator (e.g., the charge on a capacitor) with the input signal voltage and generating an "up a bit" (1) or "down a bit" (0) decision. The integrator (charge on the capacitor) is then incremented or decremented by a certain step such that it follows the input signal. Steps of +stepsize or −stepsize are applied to the integrator. This is an "analog" signal (though it could be regarded as a binary digital signal also) but it is not a smooth waveform. Both the delta-sigma A/D and D/A conversions function this way. By transmitting the up/down steps and applying them to a remote integrator, the same voltage waveform may be reproduced, showing the information contained in the bit stream.

The quantization noise inherent in digitization due to high bit rate delta modulation decreases by 9 dB every time the bit rate (the rate of up/down steps) is doubled. If steps are applied twice as frequently to the integrator, they only need to be half the size to follow the same signal rate-of-change. Thus, the step-wise signal follows the input signal twice as closely, resulting in an improvement of 6 dB. Additionally, the deviations of the step-wise signal from the input signal occur at twice the frequency, spreading the quantizing noise over twice the bandwidth such that only half as much overlaps the signal spectrum region. The noise outside this region will be removed by a low pass filter that passes only the wanted signal spectrum and not the higher frequency components of the step-noise. This additional factor is worth a further 3 dB, such that the total quality improvement when doubling the bit rate is 9 dB.

A block diagram of digitization based on oversampled delta modulation is illustrated in FIG. 1. The input speech signal is applied to one input of a comparator 1 while the output of an integrator 2 is applied to the other input. The comparator output is a binary, high/low decision, and is clocked into flip-flop 3 by the high bit rate delta-modulation clock, which is N times the desired final output sample rate. The up/down decisions control switch 4 to select a positive or negative voltage to apply to the integrator 2, such that it follows the input signal in a step-wise fashion. At the same time the up/down decisions are applied to a digital integrator 5 such that its output value also follows the same pattern, but as a numerical representation of the signal. The instantaneous value of the digital integrator 5 changes every clock tick, which is N times the desired output sample rate. These values are applied to a digital low-pass (or decimating) filter(s) 6 which removes the rapid fluctuation of the value within each period of N successive clock ticks while permitting it to vary at slower, underlying speech frequencies up to 3.4 kHz. After digital low-pass filtering, the value may be sampled at the desired output sample rate of 8000 samples per second, fulfilling the Nyquist requirement for no information loss, i.e., the sampling rate must be at least twice the highest frequency component of the signal (now 3400 Hz).

One advantage of the known, over-sampled delta-modulation technique is that no analog, anti-aliasing filter cutting off at 3.4 kHz is required, since this function is performed digitally. Additionally, no precision analog components are required, and virtually all the components used are digital logic suitable for integration on a silicon chip.

A disadvantage of this technique for some applications is that a high oversampling factor N of typically 256 is needed to achieve the required 13-bit dynamic range. Thus, the decimation filters have to perform many calculations per second, increasing the power consumption of the digital portion. Various publications such as Naus et al., "A CMOS Stereo 16-bit D/A Converter for Digital Audio," *IEEE Journal of Solid State Circuits*, Vol. SC22, No. 3, June 1987, have addressed methods of achieving higher quality using lower oversampling factors. Such methods are based on having a feedback filter more complicated than a simple integrator to shape the quantization noise spectrum such that less noise falls inside the 3.4 kHz speech band.

The present invention includes a new technique for digitization of analog speech which is based not on noise shaping but on companding (COMpressing the volume of a signal at one point and restoring it through exPANsion at another point) such as companded delta-modulation. The most well-known companded delta-modulation principle is called Continuously Variable-Slope Delta or CVSD modulation, and has been employed in applications where low bit rate delta-modulation was the final coding form in which the speech was desired for transmission or storage.

CVSD has been widely used for military radio communications at the rates of 16 K bits/sec., 19.2 K bits/sec. and 32 K bits/sec. At the latter bit rate, the quality is generally considered to be comparable to good telephone quality.

A block diagram of a known CVSD speech coder is shown in FIG. 2. The input speech signal is first restricted in bandwidth to the 0–3.4 kHz range by a low-pass, anti-aliasing filter 7. The filtered speech is then applied to one input of a comparator 8 while the output of the principal integrator 9 is applied to the other input.

High/low decisions from the comparator 8 are registered in a flip flop 10 at every tick of the bit rate clock (not shown). The high/low decision registered in the flip-flop 10 controls the selection of either a negative step voltage or a positive step voltage applied to the principal integrator 9 via the step sign switch 13. The high/low decisions are also delayed in the flip-flops 11 and 12 such that three consecutive decisions are available to the modulation analyzer 14. The modulation analyzer 14 detects when three consecutive decisions are the same (up up up or down down down) and determines when the integrator 9 is having difficulty following the rate of change of the input signal with the current step size. The modulation analyzer 14 then delivers a pulse to a syllabic filter 15 to augment the step size. If no pulse is delivered, the syllabic filter 15 allows the step size to decay exponentially until it finds a natural balance with the input signal such that the integrator 9 can just follow the input signal using a minimum step size. The step size thus adapts to the input signal level. Furthermore, the step size adapts quickly to changes in the level between different words and syllables of words, hence the name "syllabic filter". Consequently, the perceived quality of the speech is maintained despite bit rates much lower than needed without companding.

The prior art for D/A conversion is analogous to the prior art for A/D conversion including the two principal methods.

Conventional D/A convertors have been based on an accurate resistor network (e.g., R-2R ladder), or over-sampled delta or delta-sigma modulation. A third prior art method uses pulse width modulation. When 13-bit accuracy or more is needed, the technique requiring accurate resistor networks may not be suitable for integration in a larger silicon chip because of conflicting process requirements. The technique of oversampled, non-companded delta-modulation has the disadvantage that the decimation filters have to operate at a high computation rate, consuming more power. The present invention employs companded delta-modulation allowing the bit rate to be substantially smaller while maintaining a given voice quality.

Utilizing CVSD as the basis for an oversampled binary A/D convertor, requiring decimation and downsampling, was previously thought to be complicated by the non-linearity inherent in companding. Thus, it is not possible, as in uncompanded delta modulation, to simply filter the bit stream. U.S. Pat. No. 3,949,299 issued to Song describes a method of digitizing speech using a limited form of companding which alleviates the above difficulty in filtering the bitstream. Song uses only seven or eight relatively coarse companding steps in the logarithmic/exponential amplitude series 1,2,4,8,16, etc. It is relatively straightforward for Song to take account of powers of two scaling in his digital arithmetic.

On the other hand, the coarse 6 dB gain steps provided by Song's powers of two step-sizes are undesirable where high quality speech is sought. Song's device is undesirable because it does not guarantee a decompanded signal that matches the companded signal and so does not preserve absolute channel gain.

SUMMARY

The present invention seeks to avoid the above limitations of the prior art, such as Song's device as well as Song's limitation to a small number of step sizes and other implementation deficiencies of the prior art. This problem is solved in the present invention by using a linear digital syllabic filter and the full digital value therefrom in the decimation process.

The present invention provides a means of converting speech to one of two desired forms: (1) a 13-bit linear equivalent PCM at 8000 samples per second, or (2) a low bitrate companded delta modulation (CVSD). This is done with the aid of the intermediate step of converting to a medium bitrate, delta modulation companded using a linear digital syllabic filter. The medium bitrate companded delta modulation is presented to a leaky digital integrator as well as an analog integrator such that a digital value is incremented and decremented in the same way as the analog integrator in order to produce a digital value that follows the speech signal in the same way as the analog integrator value follows the speech signal. Then the digital representation is filtered in a digital filter to remove high frequency step-noise, and sampled at the required output rate. This combination of digital low-pass filtering with reduction of the sampling rate is the "downsampling" or "decimation" referred to above.

A circuit for converting an analog waveform signal to a digital waveform according to the present invention includes an integrator means for generating an integrated signal, and means for comparing the analog waveform signal with the integrated signal and registering a series of decisions, one decision per a regular interval. Further included are, a means for setting a step sign of the integrated signal based on a most recent of the registered decisions, a syllabic filter means for selecting a step magnitude based on the registered decisions, and a decimation filter means for processing the step sign and the step magnitude to generate a sequence of binary coded digital signals representative of the analog waveform signal. In one embodiment the integrator means includes at least one programmable current source connected to a capacitor which may be programmed according to the desired step magnitude or the current pulse width.

The syllabic filter means may include means for successively storing the registered decisions as a bit sequence and logic means for performing logic operations on the bit sequence and generating an accumulated value indicative of the step magnitude according the logic operations. The decimation filter may include a leaky integrator for integrating a bit sequence to obtain a numerical value and subtracting a fraction of the numerical value from the numerical value at regular intervals.

The step magnitude, according to a preferred embodiment, is a 12-bit binary coded value. The binary coded value controls a first programmable current source according to a number of least significant bits and a second programmable current source according to the number of most significant bits.

Another analog to digital conversion circuit according to the present invention includes means for comparing an analog input signal with a voltage on a capacitor and registering a series of decisions, one decision per a regular interval and at least one pulse width modulated current source for controlling the capacitor according to the series of decisions. This circuit may also include an accumulator that is modified in step with control of the capacitor by the pulse width changes. In addition to an accumulator, also included may be means for adding N successive values of the accumulator producing a series of binary coded output values, wherein there is one binary coded output value per N modification periods of the accumulator, and the binary coded values represent the analog input signal. The series of decisions in this embodiment may be output as a companded delta-modulation bit stream representative of the analog input signal.

A circuit for converting a plurality of binary coded numerical signal samples to an analog signal waveform according to the present invention includes means for interpolating between successive binary coded numerical signal samples to produce N interpolated samples for each binary coded numerical signal sample, means for comparing the interpolated samples with values in a digital integrator and registering a series of decisions, and means for modifying the digital integrator values according to the decisions by a step sign. Also included are syllabic filter means for generating a step magnitude for modifying the digital integrator values depending on a successive number of the decisions, leaky analog integrator means for receiving the step sign and step magnitude and generating an analog signal described numerically by the digital integrator values, and means for filtering the analog signal to produce an analog waveform corresponding the binary coded numerical signal samples.

The syllabic filter means may be constructed similar to the same described above. The analog integrator means may include at least one programmable current source connected to a capacitor. The at least one programmable current source may be programmed as mentioned above.

In another embodiment of the present invention, a digital to analog conversion circuit includes means for receiving a companded delta-modulation bit stream, and syllabic filter means for generating a plurality of variable step magnitudes based on a successive number of bits in the bit stream. Further included are integrator means, modified by the variable step magnitudes according to a sign of bits in the bit stream, for generating an analog output signal, and means for filtering the analog output signal to produce an analog waveform corresponding to the bit stream.

A method of converting an analog waveform signal to a digital waveform signal according to the present invention includes the steps of generating an integrated signal, comparing the analog waveform signal with the integrated signal and registering a series of decisions, one decision per a regular interval, and setting a step sign of the integrated signal based on a most recent of the registered decisions. Additionally included are the steps of selecting a step magnitude based on the registered decisions and processing the step sign and the step magnitude to generate a sequence of binary coded digital signals representative of the analog waveform signal.

A method of converting a plurality of binary coded numerical signal samples to an analog signal waveform according to the present invention includes the steps of interpolating between successive binary coded numerical signal samples to produce N interpolated samples for each binary coded numerical signal sample, comparing the interpolated samples with values in a digital integrator and registering a series of decisions. Also, the following steps are included: modifying the digital integrator values according to the decisions by a step sign, generating a step magnitude for modifying the digital integrator values depending on a successive number of the decisions, receiving the step sign and the step magnitude and generating an analog signal described numerically by the digital integrator values, and filtering the analog signal to produce an analog waveform corresponding to the binary coded numerical signal samples.

BRIEF DESCRIPTION OF THE DRAWINGS

The present invention will now be described in more detail with reference to preferred embodiments, given only by way of example, and illustrated in the accompanying drawings, in which.

DETAILED DESCRIPTION

Figure 3:
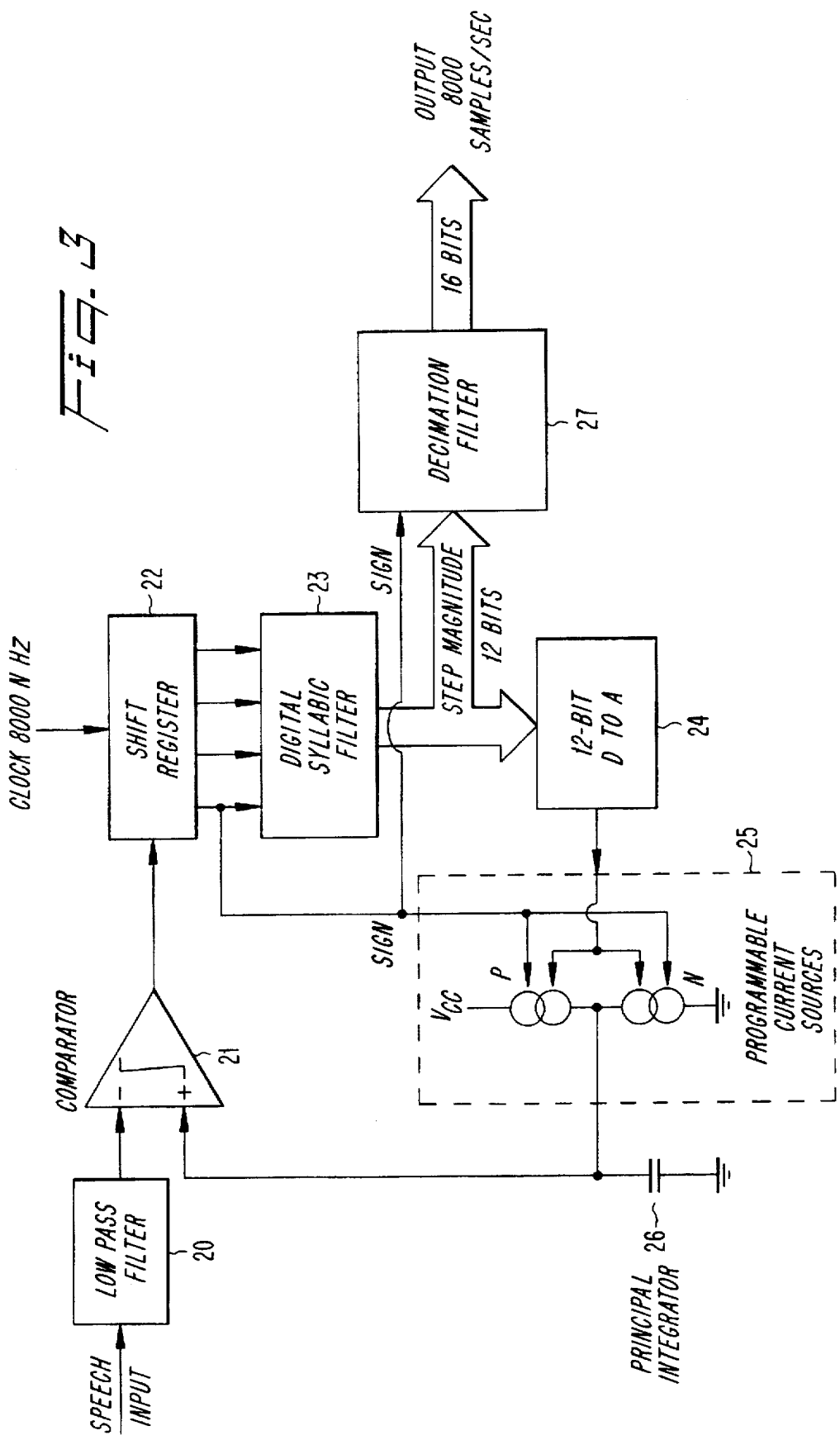
FIG. 3 represents an exemplary speech encoder according to the present invention.

According to the present invention shown in FIG. 3, the input speech is low-pass filtered in a filter 20. The filter bandwidth is 0–3.4 kHz, the attenuation at 4 kHz and above helping to keep the digital decimation filter simple. The delta-modulation bit rate is either 200 K bits/sec. or 240 K bits/sec. with the corresponding oversampling factor N being 25 or 30.

The filtered speech is applied to one input of a comparator 21 with the principal integrator 26 output applied to the second input. The principal integrator 26 is formed by a capacitor connected between the output of a programmable current source 25 and ground. The programmable current source 25 generates a pull-up current from an integral current source made with P-type transistors, or a pull-down current from an integral current source made with N-type transistors, such that the voltage on the capacitor may be incremented or decremented to follow a speech signal. The sign change, up or down, is determined by the high/low decision of the comparator 21 as registered at every clock tick in the first flip-flop stage of a shift register 22. This controls whether the P or N type current source in the programmable current source 25 is enabled.

The shift register 22 also delays the up/down decision in three further stages, such that four consecutive decisions are available to a digital syllabic filter 23. Depending on the pattern of the four decisions, the syllabic filter 23 either increments a 12-bit value by one or two, decrements it by one or two, or does nothing. The resulting 12 bit value represents the step magnitude that shall be used for incrementing or decrementing the principal integrator 26. This 12-bit digital representation of the step magnitude is used to program the current level of the programmable current source 25 via a 12-bit D/A convertor 24.

Figure 7:
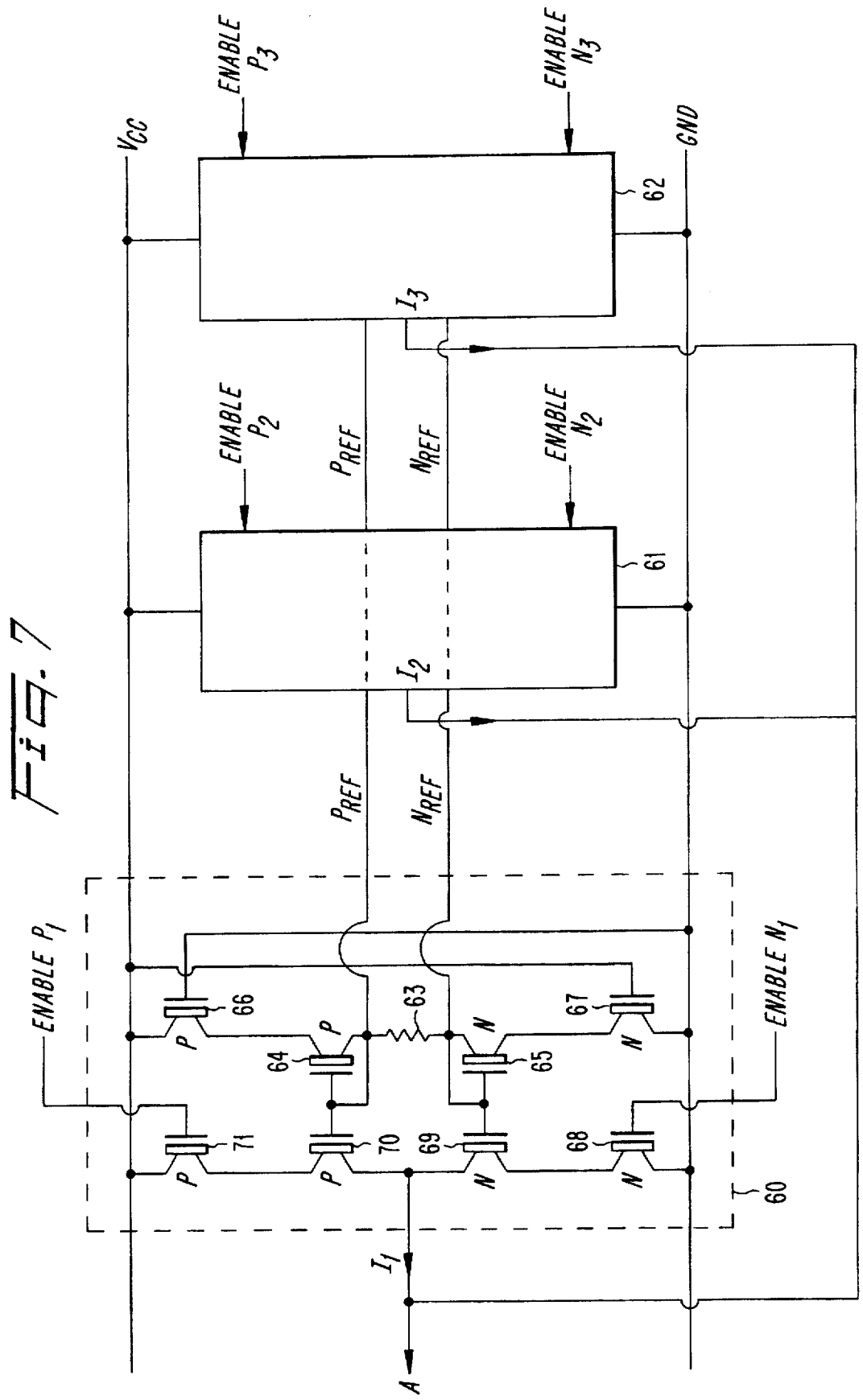
FIG. 7 shows an exemplary programmable current source configuration and a 12-bit D/A convertor according to the present invention.

The 12-bit D/A convertor 24 is formed by splitting the 12-bit word into three 4-bit nibbles, which control the current in three parallel current sources 60, 61, and 62 as shown in FIG. 7 having current ratios of 1:16:256. The current from each source is controlled by using its associated 4-bit control nibble to control the width of its current pulse to one of 16 values. The principal integrator 26 thus follows the speech signal in a series of not necessarily equal up or down steps. The step magnitude is given by the 12-bit output from the syllabic filter 23 while the step sign is determined by the comparator decision. The 13-bit combination is thus a sign-magnitude representation of the series of steps. When the sign/magnitude representation of the series of steps is integrated digitally in a decimation filter 27, a numerical facsimile of the analog voltage on the capacitor of the principal integrator 26 is created.

Figure 6:
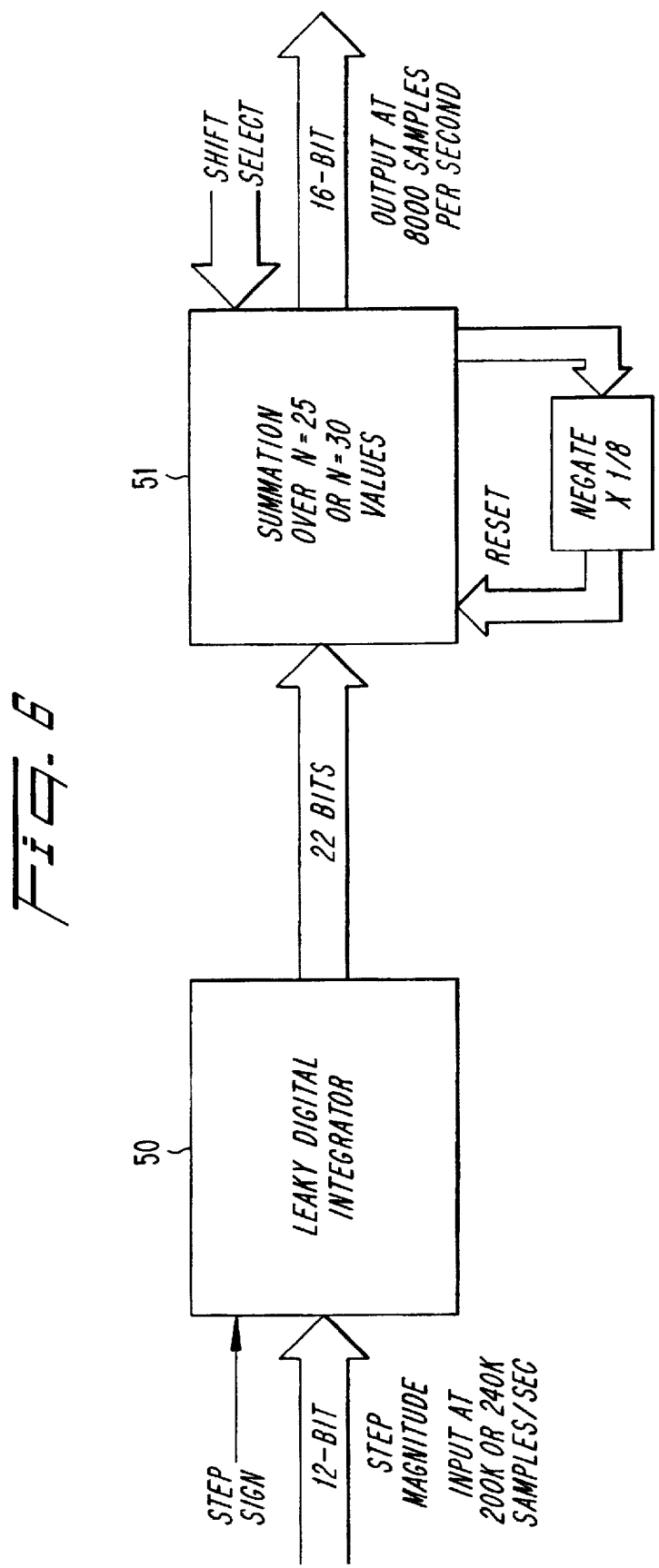
FIG. 6 shows an exemplary decimation filter according to the present invention.

The decimation filter 27 accumulates the sign-magnitude step representation in a digital accumulator, which is part of the decimation filter 27. The accumulator subtracts a fraction, $1/512$th, of its accumulated value from the accumulated value at every iteration to make it a leaky integrator 50 as represented in FIG. 6. This ensures that the accumulated value does not drift to one extreme or another. The fraction $1/512$th, corresponds to a high-pass filter having a corner frequency of approximately 64 Hz.

The decimation filter's first operation may be expressed mathematically as:

$$I(i)=(1-1/512).I(i-1)+D(i)$$

where D(i) is the step size including the sign. Equating the factor $1-1/512$ with an exponential decay factor per clock tick period T, $$EXP(-\omega T)=1-1/512,$$

results in $\omega T=1/512$, so for $T=1/200000$, $\omega$ is just less than 400 radians/sec corresponding to 64 Hz.

The second stage of the decimation filter 27 computes the sum of the integrated values over N values. The sum is then output every 8000 Hz period.

The frequency response of the above decimation filter 27 corresponds to a $(\sin(x)/x)$ squared function, where $$x=\pi.f/8000=\omega/16000$$

with f being the frequency in Hz and $\omega$ the frequency in radians/sec. This results in an attenuation of 2.75 dB at the highest speech frequency of 3.4 kHz. To compensate for the attenuation, the accumulator of the final stage is not reset to zero prior to the next addition of N values, but to minus one eighth of the previous result. This results in emphasizing the higher speech frequencies and compensating for the (sin(x)/x) roll-off. This contrasts with Song's prior art decimation filter in which high frequency roll off was avoided by not accumulating all the samples, which has the disadvantage of poorer noise reduction.

Figure 4:
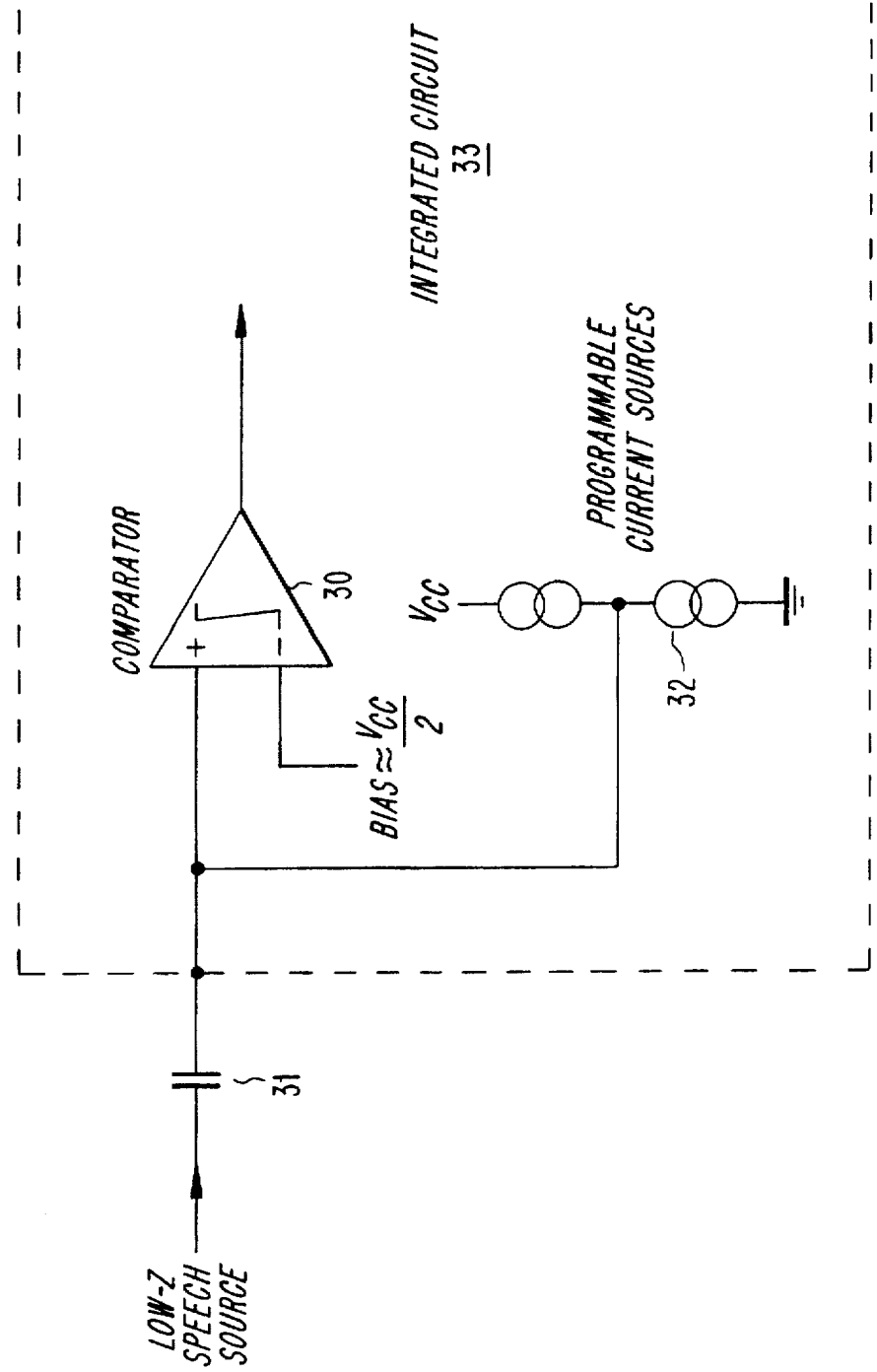
FIG. 4 represents an exemplary configuration of a comparator and principal integrator for a speech encoder of the present invention.

An alternative arrangement for the comparator and principal integrator is shown in FIG. 4. The comparator 30 and the programmable current source 32 are incorporated in a larger integrated circuit 33. The current source 32 is connected to one comparator input and to one end of the principal integrator capacitor 31. The speech signal to be encoded is applied to the other end of the integrator capacitor 31. The voltage developed by integrating the current from the current source 32 flowing through the capacitor 31 is subtracted from the input speech signal. The remainder from this subtraction is compared in the comparator 30 with a fixed bias voltage at half supply (Vcc/2). The comparator 30 produces an up/down decision that controls the current source 32 in a manner analogous to that disclosed with reference to the FIG. 3 embodiment such that the comparator input voltages are equal. The benefit of this arrangement is the number of pins required for the chip is reduced, and the comparator is simplified because its inputs only need to operate around a fixed bias point.

Figure 5:
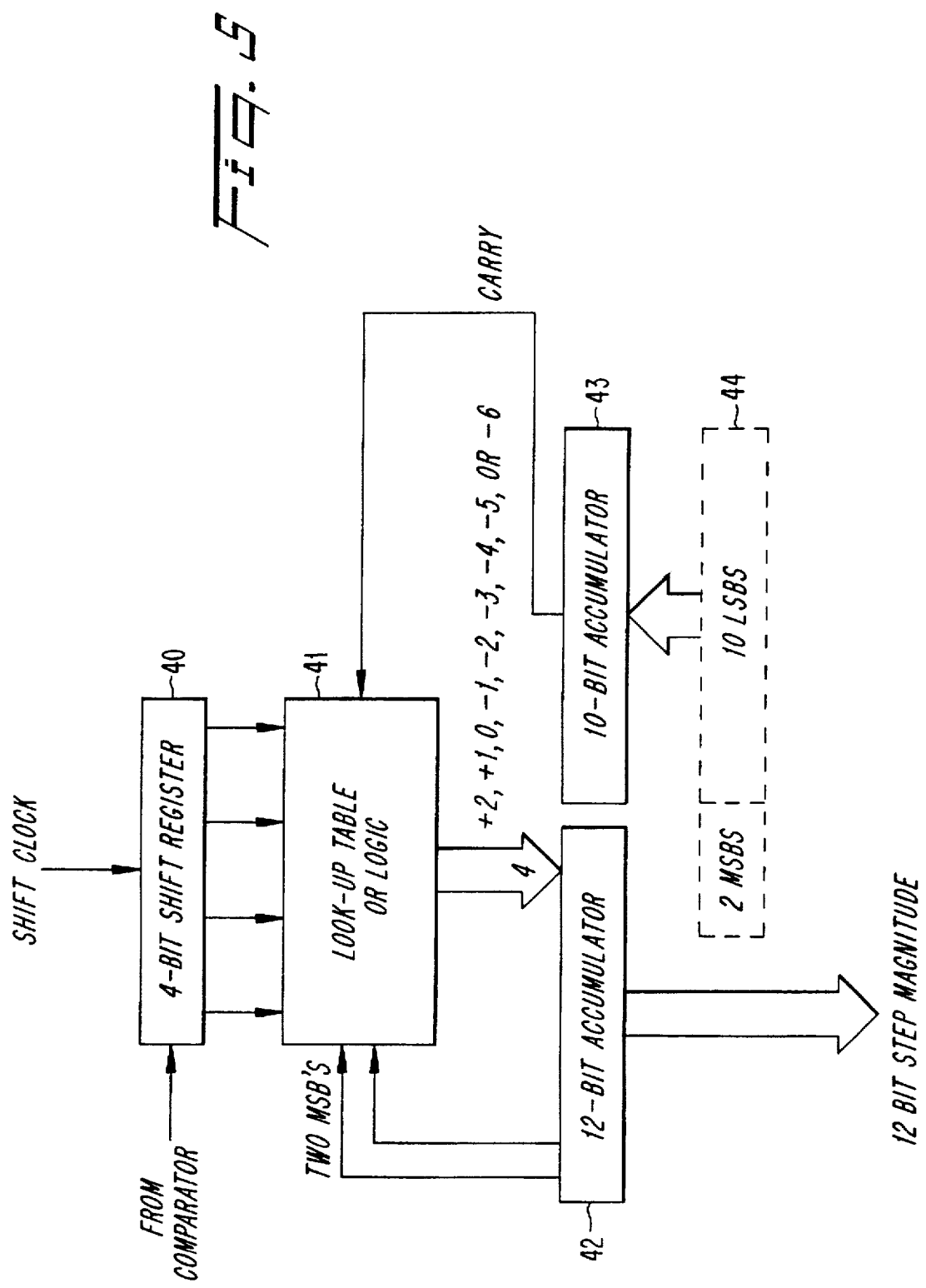
FIG. 5 shows an exemplary configuration of a syllabic filter according to the present invention.

The operation of a syllabic filter according to the present invention is shown in FIG. 5. Four consecutive comparator decisions are available in shift register 40. These decisions determine whether the 12-bit accumulator 42 is incremented by 2 or 1, decremented by 2 or 1, or left unchanged. These options are chosen according to look up table or logic 41 shown in the following table:

| Latest decision | Oldest decision | | Increment |
|---|---|---|---|
| 0 | 0 | 0 | 0 | 2 |
| 0 | 0 | 0 | 1 | 2 |
| 0 | 0 | 1 | 0 | 1 |
| 0 | 0 | 1 | 1 | 0 |
| 0 | 1 | 0 | 0 | 0 |
| 0 | 1 | 0 | 1 | −1 |
| 0 | 1 | 1 | 0 | −1 |
| 0 | 1 | 1 | 1 | −2 |
| 1 | 0 | 0 | 0 | −2 |
| 1 | 0 | 0 | 1 | −1 |
| 1 | 0 | 1 | 0 | −1 |
| 1 | 0 | 1 | 1 | 0 |
| 1 | 1 | 0 | 0 | 0 |
| 1 | 1 | 0 | 1 | 1 |
| 1 | 1 | 1 | 0 | 2 |
| 1 | 1 | 1 | 1 | 2 |

In addition, the 12-bit accumulator 42 becomes a leaky integrator by subtracting $1/1024$th of its accumulated value from its accumulated value during each iteration. This ensures that the accumulated value does not drift to one extreme or the other, and that the effect of any arbitrary starting value decays exponentially with time.

The bit positioning of the 12-bit accumulator 42 is shown in block 44 when shifted back (to the right) 10 places corresponding to division by 1024. Its two most significant bits overlap its two least significant bits and must be subtracted. This is achieved by modifying the increment produced by the above Table.

In summary, the basis of the medium bitrate companded delta modulator is an integrator that is forced to track a speech signal by incrementing it or decrementing it by a stepsize. The stepsize is also increased or decreased in order to give better tracking by 2,1,0,−1 or −2 respectively. The stepsize is contained as a digital number in a 12-bit accumulator that can be incremented or decremented by the above amounts. In addition, this integrator is "leaky", meaning that a fraction 1/1024 of its current value is subtracted at every clock tick. The purpose of this is to ensure that older values have an exponentially decaying residual effect on current values, and in particular that the effect of an arbitrary starting value upon switch on does not persist for more than a few milliseconds.

In order to subtract 1/1024th of a 12-bit value from itself, it must be shifted back 10 binary places and then subtracted from itself as illustrated below:

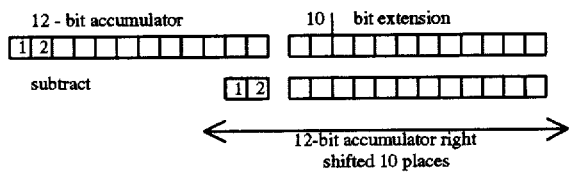

It can be seen that only the two most significant bits 1 and 2 then overlap the original 12-bit value, and so no leaky effect would be produced for values having two zero MSBs. To ensure that the desired leaky accumulator effect is achieved for all values, the accumulator is provided with a ten-bit extension that accumulates the least significant ten bits of the subtrahend that do not overlap the 12-bit accumulator. When the 10-bit extension overflows, it means that the missed 10-bit fractions have accumulated to total one least significant bit of the 12-bit accumulator, so that an additional 1 must be subtracted in addition to the two overlapping bits 1 and 2.

Thus the total range of numbers which may have to be subtracted from the 12-bit accumulator are:

| | |
|---|---|
| basic stepsize increment/decrement: | 2, 1, 0, −1, −2 |
| Bits 1 and 2 of the 10-bit shift: | 0, −1, −2 or −3 |
| Overflow from 10-bit extension | 0 or −1 |
| Total of the above combinations: | 2, 1, 0, −1, −2, −3, −4, −5, or −6 |

Which of these nine values that shall be added/subtracted from the 12-bit accumulator is a function of the stepsize increment determined by four consecutive comparator decisions, the current two MSBs of the accumulator, and the state of overflow from the 10-bit accumulator extension. Thus, all seven of these bits are provided as inputs to look-up table 41, which is preprogrammed with the correct one of the above nine values for each of the 128 possible combinations of the seven address bits that can arise.

To achieve the 10-bit extension, the 10 least significant bits are accumulated in the 10-bit accumulator 43 and only have an effect if a carry is produced across the 10–12 bit boundary. This carry may also be accounted for by modifying the above Table by 0 or −1 whether or not a carry is produced. Thus look-up table 41 has extra inputs from the two least significant bits (LSBs) of the accumulator 42 and from the carry output of the 10-bit accumulator 43 and contains the appropriate entries between +2 and −6 for each possible state of the input lines. A four bit number suffices to represent these nine possible values in sign/magnitude form. The sign controls the accumulator 42 to effect addition or subtraction of the 3-bit magnitude. The 12-bit magnitude is output as the step size to use in incrementing or decrementing the principal integrator 26 or 31 shown in FIGS. 3 and 4, respectively. In a preferred implementation, serial arithmetic can be used for the accumulator additions or subtractions in order to minimize the gate count in the integrated circuit.

The look-up table contents have been empirically determined to yield the best results on a typical speech signal. However, other table contents may yield equally good or better results. Similarly, the number of comparator decisions used to affect the choice of the step size is not fundamental. For example, there could be small gains for using a larger number of comparator decisions to affect the stepsize. The exact adjustments to the step size according to past decisions has been the subject of numerous publications. Any such empirically optimized step size adaptation strategy may be incorporated within the current invention. However, the step size adaptation still should depend on the current step size in order to provide a leaky syllabic integrator according to the invention.

An exemplary decimation filter according to the present invention is shown in FIG. 6. The step sign and 12-bit step magnitude are first integrated in a leaky integrator 50. The leak is provided by subtracting 1/512th (0.000000001) of the integrator's accumulated value from the accumulated value on each iteration. This provides the integrator with a potential "gain" of 512 if a constant value is presented to the integrator 50, thus expanding the word length from 12 bits plus a sign bit to 22 bits two's complement representation. The leaky integrator value is 12 bits and a sign, which is the same as 13 bits two's complement representation. When presented with a constant input value to integrate, the integrator value will increase until the magnitude of the "leak" equals the constant, so it stops rising. Since the leak is 1/512th of the integrator value, the value at that point must be 512 times the constant, i.e., 9 bits longer. Thus, the leaky integrator length is 13+9=22 bits.

The 22-bit result is summed over N consecutive values in a summer 51 to downsample the signal to the required 8000 sample per second rate.

Since N is 25 or 30 in a preferred implementation, a further potential expansion in word length to 27 bits results. If two 22-bit values are added, the maximum possible result is double the value, giving one more MSB, i.e., an expansion from 22 to 23 bits. If four MSBs are added, result is 24 bits. If eight MSBs are added, result is 25 bits. If 16 MSBs are added, result is 26 bits. If 32 MSBs are added, result is 27 bits. The latter 27 bit length is desirable because the number of values added (25 or 30) is greater than 16 but not more than 32. With normal speech at a nominal level, the full 27-bit dynamic range may never be utilized. Therefore, it may be advantageous to choose the 16 bits from a lower significant shift instead of the most significant 16 bits for output.

Since it may not be possible to decide on the best shift for all applications in advance, a provision is made to select the 16-bit shift that will be output by the "shift select" control input.

After generating a sample, the summer 51 is not reset to zero prior to the next summation period, but to −1/8th of the value just output in order to provide sin(x)/x frequency response correction. Serial arithmetic can be used to save silicon area. Resetting the accumulator to −1/8th of its previous value is simply achieved by recirculating the 27-bit shift register contents with a 3-bit delay, inversion and sign extension.

The programmable current sources are required to generate current pulses in the direction indicated by the step sign and the magnitude given by the step size. In contrast with normal D/A or A/D convertor requirements, the speech signal waveform is entirely represented by a sequence of signs, and only its amplitude is governed by the step magnitude. Therefore, non-linearities or errors in converting the 12-bit magnitude to a current do not cause distortion of the speech signal, but result in gain variations through the system. It suffices therefore if the 12-bit D/A has 8-bit accuracy over its 12-bit dynamic range.

Figure 1:
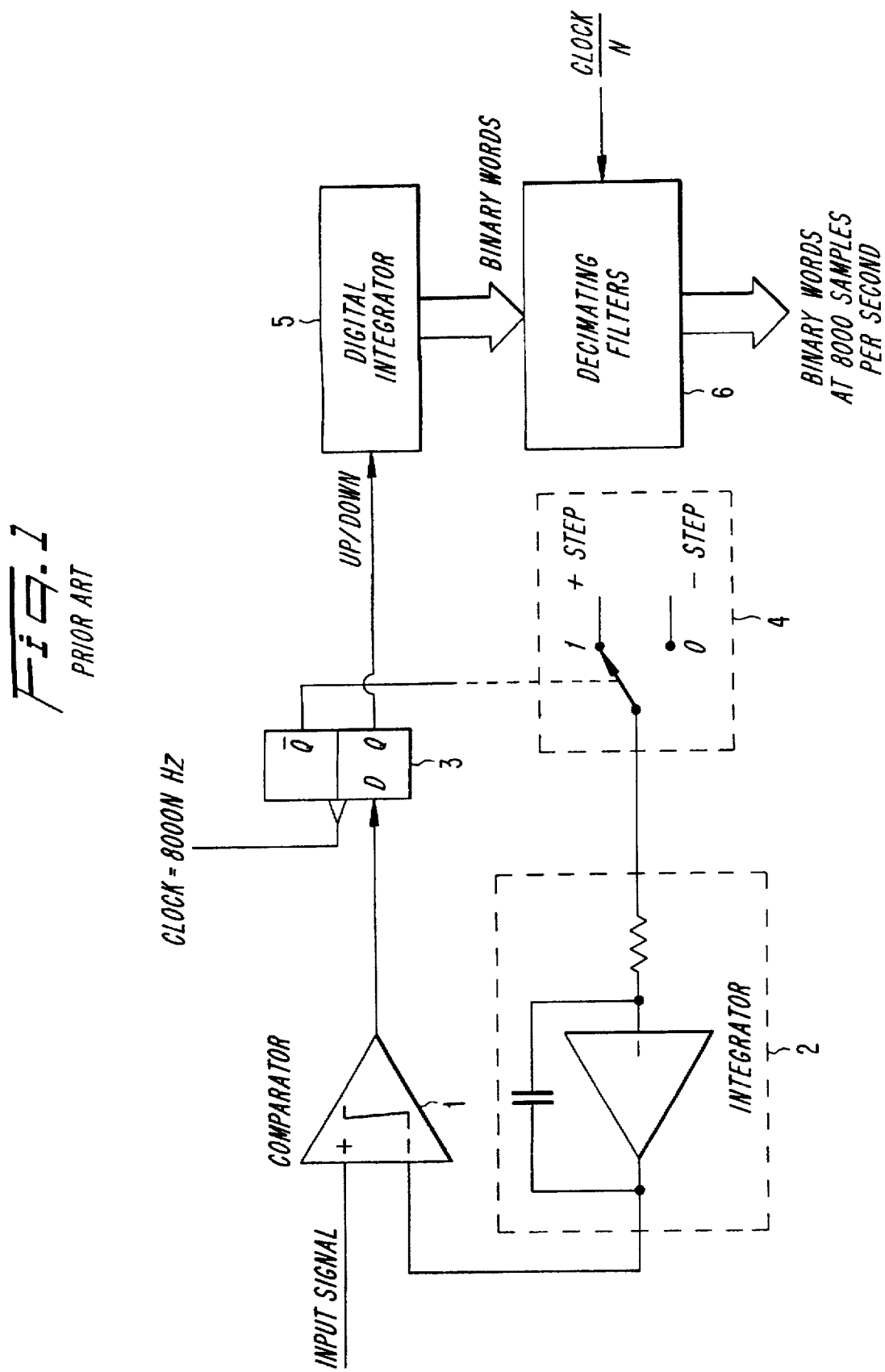
FIG. 1 shows an exemplary conventional oversampled delta-modulation A/D convertor.
Figure 2:
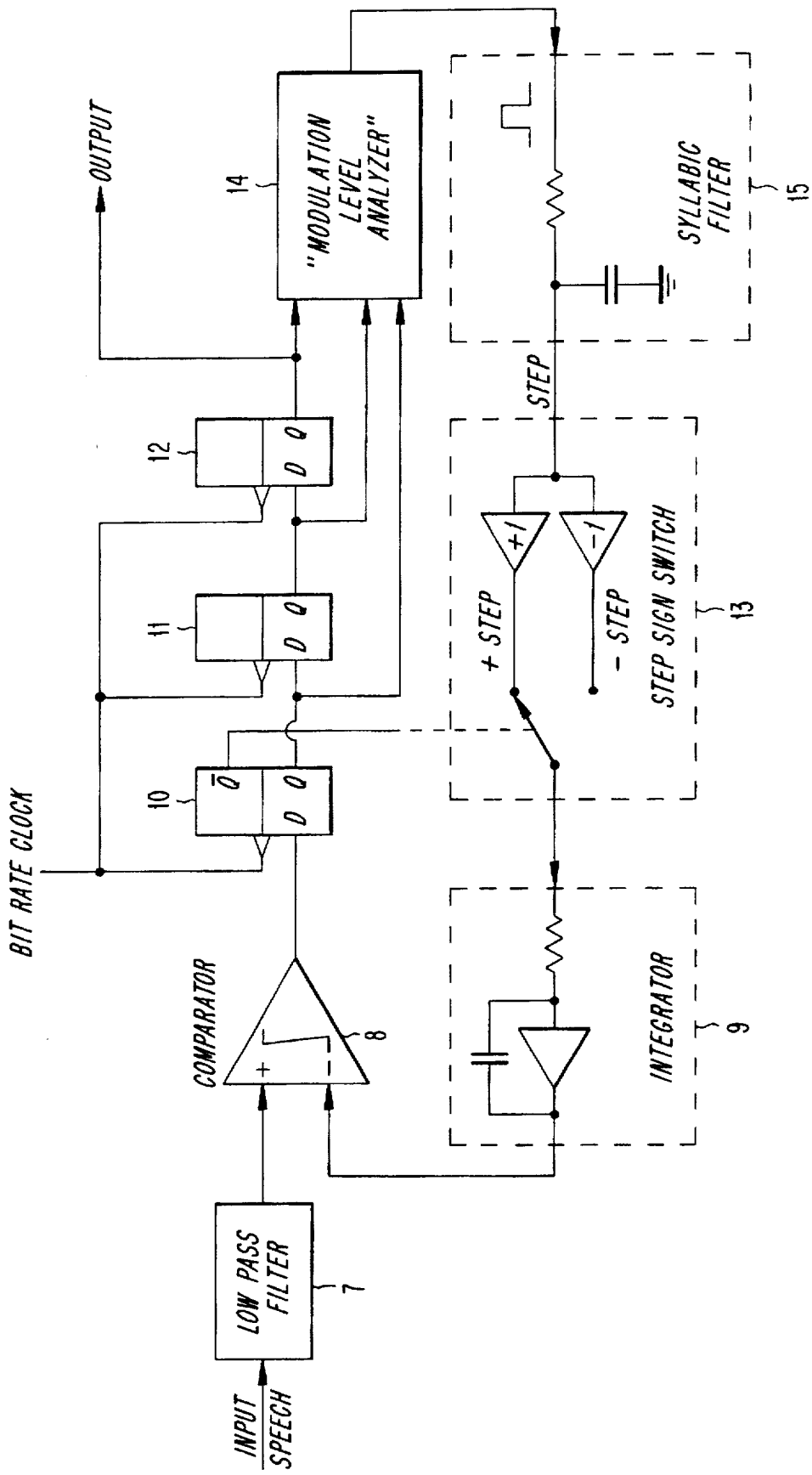
FIG. 2 shows an exemplary conventional CVSD speech coder.

An exemplary programmable current source arrangement according to the present invention is shown in FIG. 7. A first current source 60 is composed of an N-type current mirror 69, 65 that may be enabled or disabled to produce a pull down current $I_1$ by a series switch transistor 68. The transistor 67 compensates for the resistance of the switch transistor 68 so that accurate current mirroring of the current in resistor 63 is achieved. A similar pull-up current source is formed by p-type transistors 70, 71, 66 and 64. Either the pull-down current can be enabled with "Enable $N_1$" or the pull-up current with "Enable $P_1$" or neither. A "cascode" current mirror circuit can be used in place of these current sources. A cascode current mirror circuit provides improved accuracy in the face of voltage variations on the output. When the advantageous comparator 30 and integrator 32 arrangement of FIG. 4 is used, the current sources operate at a constant output voltage and cascode current mirrors are not needed. If the comparator arrangement of FIG. 1 is used, cascode current sources are recommended.

The current source 6 produces a pull down or pull up current $I_2$ when enabled. A second current source 61 produces a current $I_2$ and a third current source 62 produces a current $I_3$. The ratio of currents $I_1:I_2:I_3$ is arranged to be 1:16:256 by suitable choice of transistor area ratios in the current mirrors. To achieve accurate ratios, the common reference lines marked $P_{ref}$ and $N_{ref}$ supply the same reference voltages to all three current sources.

Figure 8:
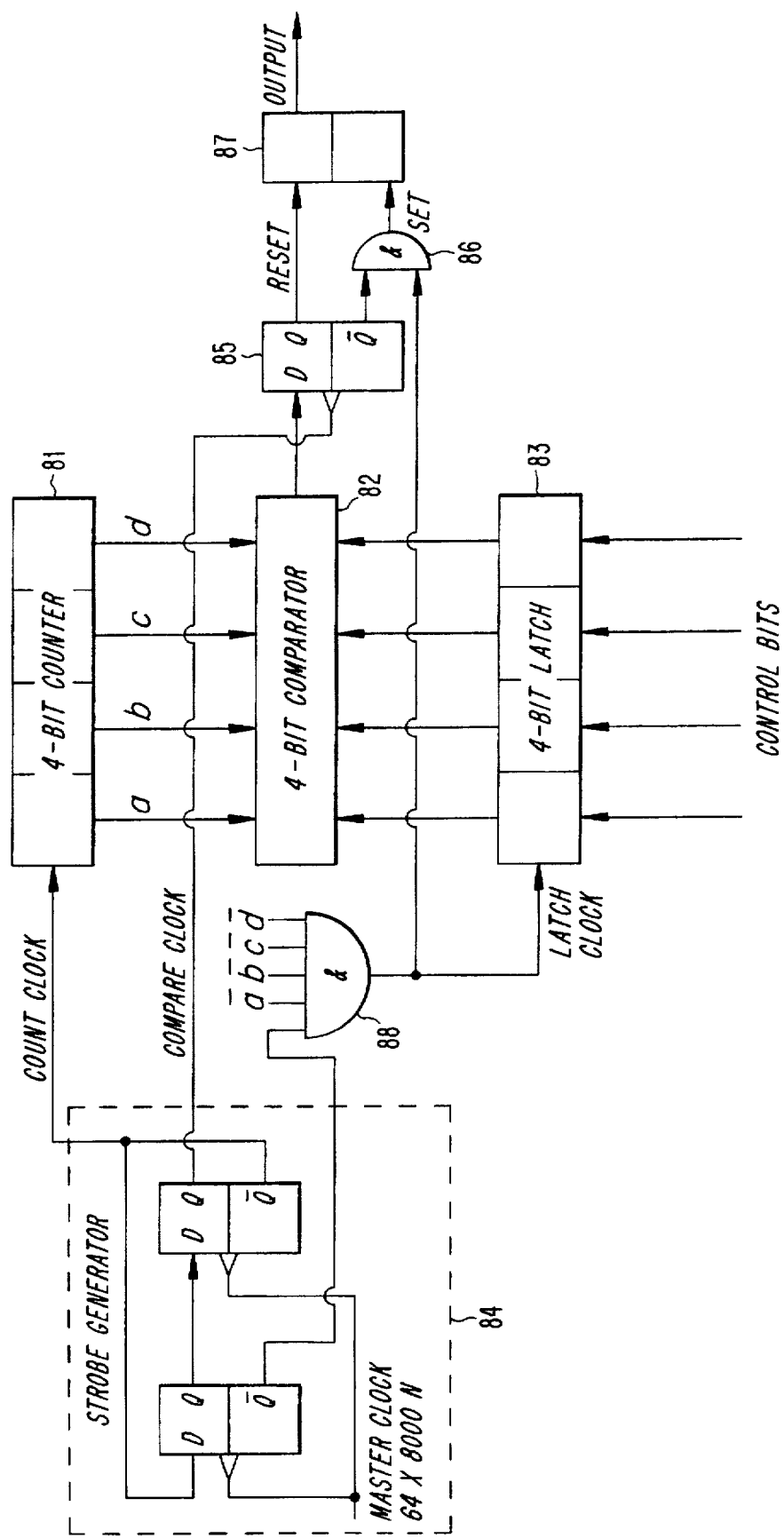
FIG. 8 shows an exemplary current pulse width controller according to the present invention.

The six enable lines to the three current mirrors are driven by three digital logic circuits as shown in FIG. 8 which enable the three p or n-type current sources with a variable pulse width determined respectively by the three, 4-bit nibbles of the 12-bit step magnitude. The step sign bit determines whether a p-type or an n-type source is enabled, while the four selected bits of the magnitude determine a pulse width between 0 and 15 units. The least significant four bits control the pulse width of the current source of least strength. The middle four bits control the pulse width of the current source of middle strength, that is 16 times the first. The most significant bits control the width of the pulse of the strongest current source, 256 times the first.

A typical circuit for generating the pulse width control signal from a 4-bit control input is shown in FIG. 8. Three such circuits are provided, one for each 4-bit nibble. A divide-by-four circuit 84 generates control strobes for the logic operation. The start of the cycle occurs when a 4-bit counter 81 is in the state a=b=c=d=0 (count=0). This enables generation of a latch clock pulse via a 5-input gate 88, which enters a new 4-bit control value into a latch 83. The next strobe generated is the compare clock signal which is sent to a flip-flop 85. This clock signal registers whether the 4-bit counter value and the 4-bit latch value have been detected to be equal by a 4-bit comparator 82. If the counter value and the latch value are detected to be unequal while the latch clock pulse is still high, then an AND gate 86 generates an output that sets a flip-flop 87. If these values are detected to be equal, the output from the flip-flop 85 resets the flip-flop 87. Thus, if the control bits were 0 at the beginning of a cycle when the counter 81 also is at zero, the flip-flop 87 remains reset, otherwise it is set.

Next, the count strobe is generated by the strobe generator 84, incrementing the counter 81. Since the condition to fulfill the AND gate 88 disappears, no further latch clock pulses will be generated until the counter 81 returns to zero. The next compare strobe registers in the flip-flop 85 whether or not the incremented count value equals the 4-bit value in the latch 83. If they are equal, the flip-flop 87 is reset. The flip-flop 87 is set until the counter 81 reaches a count equal to the 4 control bits input to the latch 83 from the digital syllabic filter 23, thus generating a pulse at the output of length 0 to 15 count clock periods. The pulse is repeated every 16 count clock periods. Thus, the output pulse duty factor ranges from 0 to $15/16$ths in $1/16$th steps depending on the control input.

The repetition period is equal to the delta-modulation bit rate, which is 8000N kHz where N is the oversampling factor (e.g., 25). The count clock must be at least 16 times the delta-modulation bit rate while the master clock is 4 times higher, i.e., 64.8000N. In one embodiment, a master clock equal to 65.8000N is available, but it delivers only a block of 64 out of each 65 clock pulses to the master clock input line of the strobe generator 84. The pulse duty factor then ranges from 0 to $60/65$ths in steps of $4/65$ths depending on the control bit input.

It will be appreciated that many other logic constructions can be devised by one skilled in the art of digital design, without departing from the scope and spirit of the invention as set forth in the claims.

In a preferred embodiment, the encoder can be controlled to operate only as a companded delta-modulation encoder at different bit rates. By bypassing the decimation filter process and changing the clock frequency to the delta-modulation circuitry, the following alternate digitizing modes can be provided:

i) Companded delta modulation at 8 K bits/sec;
ii) Companded delta modulation at 16 K bits/sec;
iii) Companded delta modulation at 32 K bits/sec;
iv) Companded delta modulation at 200 K bits/sec, converted to 13-bit linear equivalent PCM at 8000 samples/sec;

The speech decoder is the counterpart of the speech encoder. The decoder accepts a stream of binary coded speech samples at, for example, the standard rate of 8000 samples per second, and converts those samples to a corresponding analog speech waveform. In accordance with the alternate operation modes provided by the encoder, the decoder of the present invention operates in corresponding alternate modes.

Figure 9:
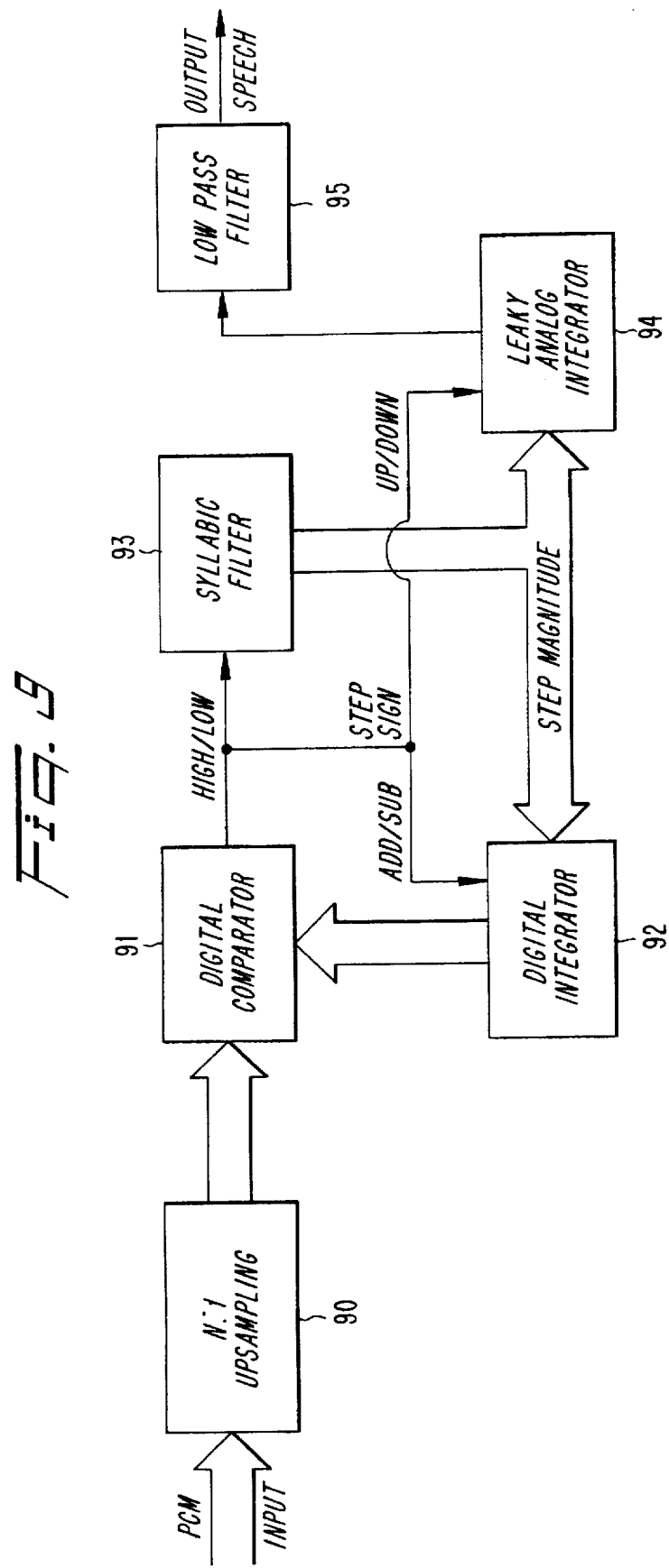
FIG. 9 shows an exemplary D/A convertor according to the present invention.

A D/A convertor according to the present invention is shown in FIG. 9. The input binary-coded speech samples (developed through PCM) at the standard 8000 samples/sec rate are first upsampled by a factor N to the desired delta-modulation rate. The upsampler 90 uses linear interpolation between successive input samples.

There is a trade-off between complexity in the interpolation technique used for upsampling and the complexity of an analog filter 95 needed to suppress components greater than half the original 8000 Hz sample rate. Higher order upsampling allows the low-pass filter 95 to be of a more relaxed design, but in an embodiment where the output speech waveform is intended to drive an earphone, adequate performance is obtained using linear interpolation.

The upsampled values are compared in a digital comparator 91 with the value in a digital integrator 92 producing a "greater than" or "less than" decision. These values are fed into a digital syllabic filter 93 of the same design as previously described with reference to FIG. 5. The syllabic filter 93 generates a step magnitude with which the digital integrator 92 will be incremented or decremented according to the sign of the comparison. The digital integrator value thus follows the sequence of upsampled input values in a series of up/down steps.

The same step magnitude and step sign are also fed to a leaky analog integrator 94. The analog integrator 94 reproduces in analog form the same waveform as described numerically by the sequence of digital integrator values. After low-pass filtering in the filter 95 to remove digital noise components greater than the maximum speech frequency of 3.4 kHz, the analog speech waveform is available, for example to drive a telephone earpiece.

Figure 10:
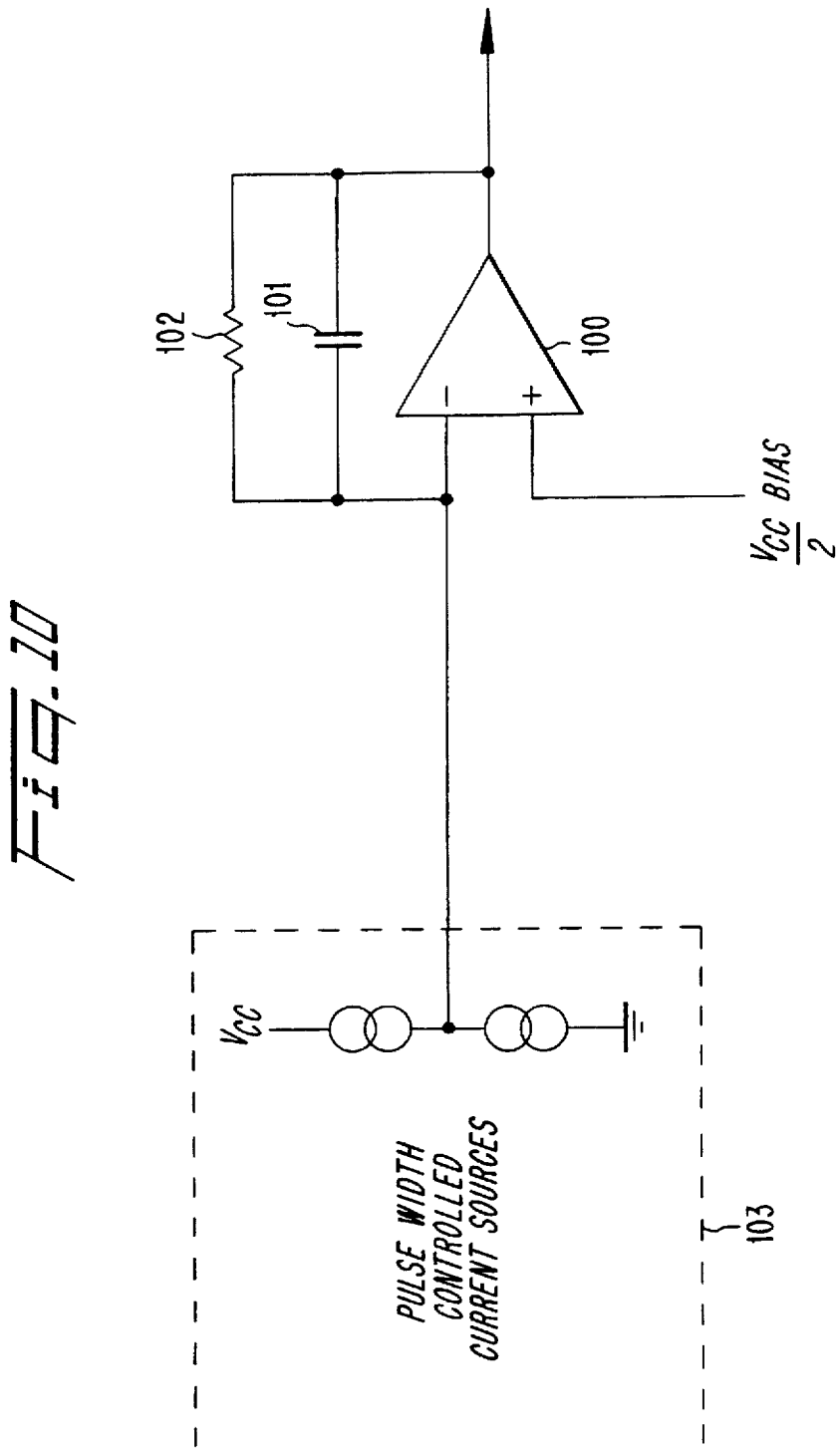
FIG. 10 represents an exemplary configuration of a leaky analog integrator according to present invention.

In the encoder (FIG. 3) of the invention, the analog integrator is in the feedback loop with the comparator, preventing drift, while the digital integrator 50 (FIG. 6) operates with an open loop, requiring a leakage component to prevent drift. In the decoder, the digital integrator 92 operates within the loop and does not need to be leaky. The analog integrator 94 operates in an open loop requiring leakage to control drift. The leaky analog integrator 94 uses the same designs of programmable current sources 60, 61, and 62 and the pulse width controller described previously with the reference to FIGS. 7 and 8. However, to introduce leakage, the integrator feedback capacitor 101 is shunted with a resistor 102 as shown in FIG. 10. This causes a reduction in gain at lower frequencies relative to a perfect integrator. If the RC corner frequency is chosen well below the 300 Hz minimum speech frequency, e.g., 60 Hz, no problem results.

Like the encoder, the current sources of the analog integrator 94 can be of a simplified design if they operate into a virtual ground, that is at constant output voltage.

A preferred arrangement of the decoder is shown in FIG. 10. The current sources 103 feed current pulses to the inverting input of an operational amplifier 100. The non-inverting input is held at a constant bias voltage, e.g., half supply voltage. The principal integrator function is provided by the feedback capacitor 101 while the leakage is provided by the feedback resistor 102. When the operational amplifier 100 has a large open loop gain, the inverting input will never depart significantly in voltage from the (bias) non-inverting input, thereby presenting the current sources with a constant voltage load.

If an alternate arrangement of just feeding the current sources into a capacitor connected to ground is employed, the varying charge on the capacitor corresponding to the reconstructed speech voltage does not present the current sources with a constant voltage load. In that arrangement, current sources of the "cascode" current mirror variety are to be used to reduce the dependence of their current accuracy on load voltage.

Figure 11:
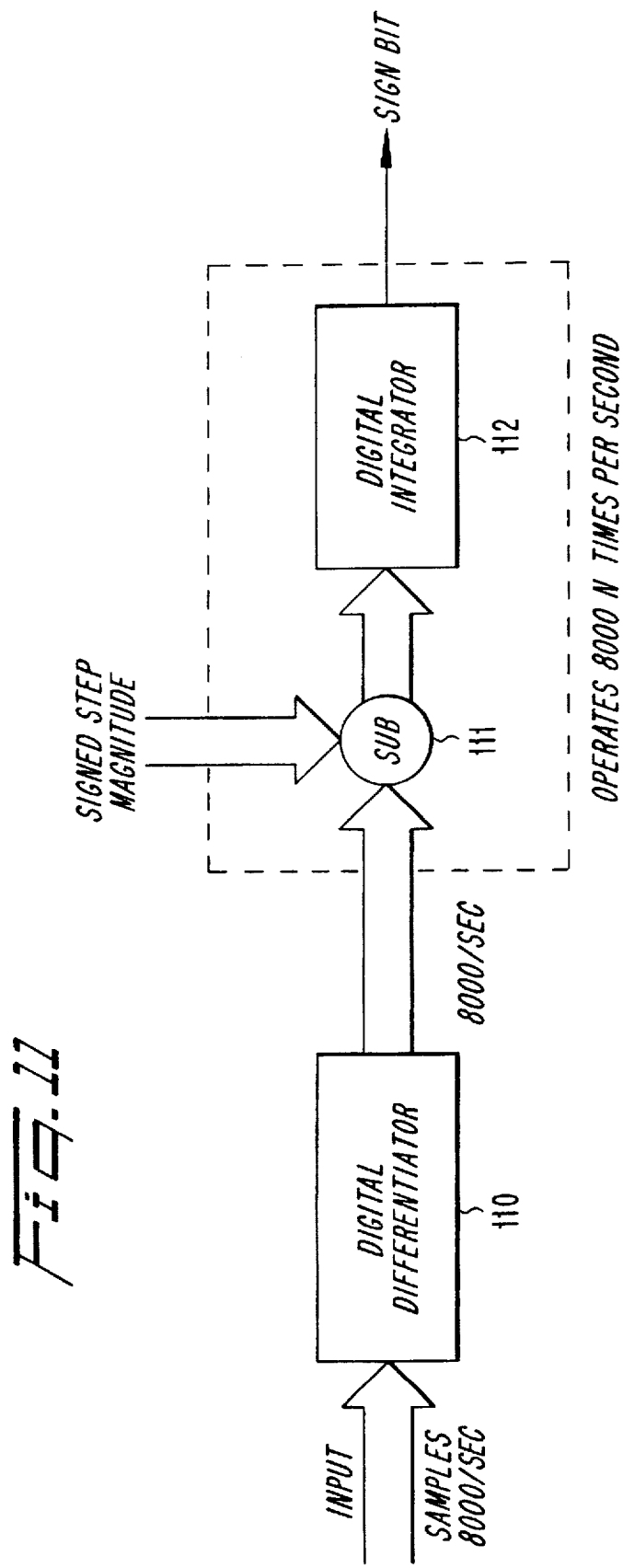
FIG. 11 represents a exemplary configuration for performing linear interpolation, integration and comparison according to an embodiment of the present invention.

FIG. 11 shows an advantageous arrangement that performs linear interpolation of the upsampling operation, integration and comparison with reduced complexity. The input sample stream is first fed to a digital differentiator 110 that computes the difference between successive samples. This is the slope needed for linear interpolation. Linear interpolation is simply achieved by integrating the slope value to produce samples at the desired output rate. This is achieved in the same digital integrator 112 which is used for integrating the step magnitude/sign, by subtracting the signed step size from the slope value in a subtractor 111 before integrating the result in the integrator 112. This appeals to the principle of linearity; the difference between the integral of A and the integral of B is equal to the integral of the difference of A and B. Furthermore, the comparator 91 is eliminated because whether integral A was greater or less than integral B is now simply given by the sign bit of the integrator 112. While the digital differentiator 110 only produces a new output value 8000 times per second, the subtractor 111 and the integrator 112 function at the unsampled rate of 8000N times per second, where the oversampled rate N is typically 25 in a preferred embodiment. Each value of slope from the digital differentiator 110 is thus added N times in digital integrator 112, giving the circuit a "gain" of N which must be taken into account in determining the overall gain through the decoder.

It can be shown that the digital differentiator 110, when approximated by simply differencing two consecutive values using a one sample delay, introduces a sin(x)/x to the fourth power function into the frequency response. This has 5.5 dB attenuation at the highest speech frequency of 3.4 kHz which is compensated for by modifying the differentiator 110 to perform the operation described mathematically by:

$$D(i)=X(i)-X(i-1)-D(i-1)/4$$

where X(i) represents the sequence of input values, and D(i) represents the output values. By subtracting ¼ of the previous output value in calculating the next, a 2 dB attenuation is produced at low frequencies rising to a 2 dB gain at high frequencies with the total 4 dB upward slope compensating all but 1.5 dB of the 5.5 dB introduced by the sin(x)/x functions.

A typical implementation of the present invention is to construct both an encoder and a decoder as part of a larger silicon chip for use in a telephone, cellular radio telephone or cordless telephone application. Other functions which may be integrated into the same silicon chip can include general purpose A/D or D/A convertors, special purpose A/D convertors used for digitizing radio intermediate frequency signals, intermediate frequency amplifiers, microphone preamplifiers, earphone driver amplifiers or digital logic associated with keypad touchtone dialing or electronic telephone number memories.

An interface for the digital speech signals presented to and accepted from the outside world is a four-wire, serial interface comprising serial 16-bit words of input PCM speech, serial 16-bit words of output PCM speech, a serial bit rate clock, and a word synchronizing strobe indicating location of a block of bits forming each binary coded output value. The same interface can be used when the chip is operated in one of its alternate, delta-modulation modes.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A circuit for converting an analog waveform signal to a digital waveform signal, said circuit comprising:

first integrator means for generating an integrated signal;

means for comparing said analog waveform signal with said integrated signal and for registering a series of increment/decrement values, one value per predetermined interval;

means for setting a step sign of said integrated signal based on a most recent of said registered increment/decrement values;

syllabic filter means for accumulating a series of registered increment/decrement values in a second, leaky digital integrator in order to select a step magnitude; and decimation filter means for processing said step sign and said step magnitude to generate a sequence of binary coded digital signals representative of said analog waveform signal.

2. The circuit of claim 1 wherein said integrator means includes at least one programmable current source connected to one side of a capacitor, the other side of which is connected to a fixed potential.

3. The circuit of claim 2 wherein current magnitude of said at least one programmable current source is programmed according to said step magnitude desired.

4. The circuit of claim 2 wherein at least one of said at least one programmable current source is programmed according to a current pulse width.

5. The circuit of claim 4 wherein said current pulse width is programmed according to said step magnitude desired.

6. The circuit of claim 2 wherein current direction of said at least one programmable current source is programmed according to said step sign.

7. The circuit of claim 1 wherein said syllabic filter means includes:

means for successively storing said registered increment/decrement values as a bit sequence; and logic means for performing logic operations on said bit sequence and for generating an accumulated value indicative of said step magnitude according to said logic operations.

8. The circuit of claim 1 wherein said decimation filter includes a leaky digital integrator for integrating said step sign and said step magnitude to obtain a numerical value and means for subtracting a fraction of said numerical value from a next numerical value at predetermined intervals.

9. The circuit of claim 8 wherein said step magnitude is added to or subtracted from said numerical value according to said step sign.

10. The circuit of claim 9 wherein said decimation filter includes means for summing said numerical value over a plurality of values and generating a sum at predetermined intervals, said sum digitally representing said analog waveform signal.

11. The circuit of claim 2 wherein said at least one programmable current source includes a first programmable source and a second programmable source, said step magnitude being a 12-bit binary coded value, said binary coded value controlling said first programmable current source according to a number of least significant bits and controlling said second programmable current source according to a number of most significant bits, a first current of said first programmable current source being added to a second current of said second programmable current source.

12. The circuit of claim 11 wherein said number of least significant bits and said number of most significant bits is four and said at least one programmable current source includes a third programmable current source controlled by four bits in said binary coded value between said most significant bits and said least significant bits, a third current of said third programmable current source being added to said first current and said second current.

13. The circuit of claim 12 wherein said first current, said second current and said third current are in the ratios 1:16:256.

14. An analog to digital conversion circuit comprising:

a comparator for registering a series of decisions at regular intervals;

an input for an analog signal connected by a series capacitor to a first input of said comparator, second input of said comparator being connected to a reference voltage source; and at least one pulse width modulated current source controlled by the output of said comparator, the current output pulse from said current source also being connected to said first comparator input.

15. The circuit of claim 14 wherein said pulse width changes depending on said series of decisions.

16. The circuit of claim 15 further including an accumulator that is modified in step with control of said capacitor by said pulse width changes.

17. The circuit of claim 16 wherein said accumulator is leaky.

18. The circuit of claim 16 including means for adding N successive values of said accumulator producing a series of binary coded output values, one binary coded output value per N modification periods of said accumulator, said binary coded values representing said analog input signal.

19. The circuit of claim 15 wherein said series of decisions are output as a companded delta-modulation bit stream representative of said analog input signal.

20. The circuit of claim 19 wherein said bit stream includes a word synchronization strobe indicating location of a block of bits forming each binary coded output value.

21. A circuit for converting a plurality of binary coded numerical signal samples to an analog signal waveform, said circuit comprising:

means for interpolating between successive binary coded numerical signal samples to produce N interpolated samples for each binary coded numerical signal sample;

means for comparing said interpolated samples with values in a digital integrator and for registering a series of decisions;

means for modifying said digital integrator values according to said decisions by a step sign;

syllabic filter means for generating a step magnitude for modifying said digital integrator values depending on a successive number of said decisions;

leaky analog integrator means for receiving said step sign and said step magnitude and for generating an analog signal described numerically by said digital integrator values; and means for filtering said analog signal to produce an analog waveform corresponding to said binary coded numerical signal samples.

22. The circuit of claim 21 wherein said syllabic filter means includes:

means for successively storing said series of decisions as a bit sequence; and logic means for performing logic operations on said bit sequence and for generating an accumulated value indicative of said step magnitude according to said logic operations.

23. The circuit of claim 21 wherein said analog integrator means includes at least one programmable current source connected to a capacitor.

24. The circuit of claim 23 wherein current magnitude of said at least one programmable current source is programmed according to said step magnitude desired.

25. The circuit of claim 23 wherein at least one of said at least one programmable current source is programmed to produce a current pulse width.

26. The circuit of claim 25 wherein said current pulse width is programmed according to said step magnitude desired.

27. The circuit of claim 23 wherein current direction of said at least one programmable current source is programmed according to said step sign.

28. A digital-to-analog conversion circuit comprising:
means for receiving a companded delta-modulation bit stream;
syllabic filter means for generating a plurality of variable step magnitudes based on a successive number of bits in said bit stream;
at least two variable pulse width current sources controlled by separate digits of said variable step magnitudes;
integrator means for integrating current pulses from said at least two current sources to generate an analog output signal; and
means for filtering said analog output signal to produce an analog waveform corresponding to said bit stream.

29. The circuit of claim 28 wherein said integrator means includes connecting at least one of said pulse width modulated current sources to a capacitor.

30. A method of converting an analog waveform signal to a digital waveform signal, said method comprising the steps of:
generating an integrated signal by integrating a series of step inputs;
comparing said analog waveform signal with said integrated signal and registering a series of decisions, one decision per predetermined interval;
setting a step sign for said integrated signal based on a most recent of said registered decisions;
selecting a step magnitude based on said registered decisions; and
decimating said step sign and said step magnitude to generate a sequence of binary coded digital signals representative of said analog waveform signal dependent on all of said sequentially produced step magnitudes.

31. A method of converting a plurality of binary coded numerical signal samples to an analog signal waveform, said method comprising the steps of:
interpolating between successive binary coded numerical signal samples to produce N interpolated samples for each binary coded numerical signal sample;
comparing said interpolated samples with values in a digital integrator and registering a series of step sign decisions;
modifying said digital integrator values according to said decisions by a step sign and step magnitude;
generating a step magnitude for modifying said digital integrator values depending on a successive number of said decisions;
processing said step sign and said step magnitude and generating therefrom an analog signal described numerically by said digital integrator values; and
filtering said analog signal to produce an analog waveform corresponding to said binary coded numerical signal samples.

32. A circuit for converting a plurality of binary coded numerical signal samples to an analog signal waveform, said circuit comprising:
means for interpolating between successive binary coded numerical signal samples to produce N interpolated samples for each binary coded numerical signal sample;
means for comparing said interpolated samples with values in a digital integrator and for registering a series of decisions;
means for modifying said digital integrator values according to said decisions by a step sign;
syllabic filter means for accumulating said series of decisions in a leaky digital integrator in order to select a step magnitude; and
leaky analog integrator means for receiving said step sign and said step magnitude and for generating an analog signal described numerically by said digital integrator values; and
means for filtering said analog signal to produce an analog waveform corresponding to said binary coded numerical signal samples.

* * * * *